United States Patent
Schultheiss et al.

(10) Patent No.: US 8,269,666 B2
(45) Date of Patent: Sep. 18, 2012

(54) HIGH FREQUENCY MODULE FOR FILLING LEVEL MEASUREMENTS IN THE W-BAND

(75) Inventors: Daniel Schultheiss, Hornberg (DE); Michael Fischer, Wolfach (DE)

(73) Assignee: VEGA Grieshaber KG, Wolfach (DE)

( * ) Notice: Subject to any disclaimer, the term of this patent is extended or adjusted under 35 U.S.C. 154(b) by 362 days.

(21) Appl. No.: 12/559,835

(22) Filed: Sep. 15, 2009

(65) Prior Publication Data
US 2010/0103024 A1  Apr. 29, 2010

Related U.S. Application Data

(60) Provisional application No. 61/109,319, filed on Oct. 29, 2008.

(30) Foreign Application Priority Data

Oct. 29, 2008 (EP) .................................... 08167856

(51) Int. Cl.
*G01S 13/08* (2006.01)
*G01F 23/284* (2006.01)
*G01S 13/00* (2006.01)
*G01F 23/00* (2006.01)

(52) U.S. Cl. ......... 342/124; 342/118; 342/175; 343/872

(58) Field of Classification Search .................. 342/118, 342/124, 175; 343/872, 873, 700 MS; 73/290 R
See application file for complete search history.

(56) References Cited

U.S. PATENT DOCUMENTS

| | | | |
|---|---|---|---|
| 3,120,640 A * | 2/1964 | Midlock et al. | 343/872 |
| 3,659,293 A * | 4/1972 | Gupta | 342/175 |
| 3,980,974 A * | 9/1976 | Yamamoto et al. | 342/175 |
| 4,200,870 A * | 4/1980 | Gabbitas | 342/175 |
| 4,205,315 A * | 5/1980 | Fleenor | 342/124 |
| 4,251,817 A * | 2/1981 | Kimura et al. | 342/175 |
| 4,254,482 A * | 3/1981 | Newman | 342/124 |
| 4,255,730 A * | 3/1981 | Sekine et al. | 343/700 MS |
| 4,259,743 A * | 3/1981 | Kaneko et al. | 342/175 |
| 4,271,411 A * | 6/1981 | Takashi | 342/175 |
| 4,290,067 A * | 9/1981 | Legille et al. | 342/124 |
| 4,319,244 A * | 3/1982 | Hirota et al. | 342/175 |
| 4,328,470 A * | 5/1982 | Bumgardner | 342/175 |

(Continued)

FOREIGN PATENT DOCUMENTS

JP  2006156609  6/2006

(Continued)

OTHER PUBLICATIONS

Carchon et al., "Integration of 0/1-Level Packaged RF-MEMS Devices on MCM-D at Millimeter-Wave Frequencies", IEEE Transactions on Advanced Packaging, vol. 30. No. 3, Aug. 2007, pp. 369-376.

(Continued)

*Primary Examiner* — Bernarr Gregory
(74) *Attorney, Agent, or Firm* — Fay Kaplun & Marcin, LLP

(57) ABSTRACT

A high-frequency module is for fill level measuring and for use at frequencies of more than 75 GHz. The high-frequency module comprises a microwave semiconductor, a printed circuit board and a housing bonded to the printed circuit board. In order to reduce the power required, operation of the microwave semiconductor takes place in a pulsed manner.

15 Claims, 4 Drawing Sheets

U.S. PATENT DOCUMENTS

| | | | |
|---|---|---|---|
| 4,332,374 A * | 6/1982 | Kremer | 342/124 |
| 5,680,139 A * | 10/1997 | Huguenin et al. | 342/175 |
| 5,914,684 A * | 6/1999 | Brettner, III | 342/175 |
| 6,404,382 B2 * | 6/2002 | Fehrenbach et al. | 342/124 |
| 6,535,161 B1 * | 3/2003 | McEwan | 342/124 |
| 6,538,598 B1 * | 3/2003 | Wilkie et al. | 342/124 |
| 6,597,309 B1 * | 7/2003 | Panton et al. | 342/124 |
| 6,642,882 B2 * | 11/2003 | Iwatani et al. | 342/175 |
| 6,703,965 B1 * | 3/2004 | Ming et al. | 342/175 |
| 6,717,544 B2 * | 4/2004 | Nagasaku et al. | 342/175 |
| 6,756,936 B1 * | 6/2004 | Wu | 342/175 |
| 6,778,132 B2 * | 8/2004 | Palata | 342/175 |
| 6,833,806 B2 * | 12/2004 | Nagasaku et al. | 342/175 |
| 6,911,935 B2 * | 6/2005 | Lyon | 342/124 |
| 7,009,562 B2 * | 3/2006 | Jenabi | 343/700 MS |
| 7,068,213 B2 * | 6/2006 | Muller et al. | 342/124 |

FOREIGN PATENT DOCUMENTS

WO    WO2008/114043    9/2008

OTHER PUBLICATIONS

Alessandri et al., "Theoretical and Experimental Characterizations of NonSymetrically Shielded Coplanar Waveguides for Millimeter Wave Circuits", IEEE MTT-S Digest, 1989, pp. 1219-1222.

Ito et al., "Low Cost Multi-Layer Ceramic Package for Flip-Chip MMIC up to W-Band", IEEE MTT-S Digest, 2000, pp. 57-60.

* cited by examiner

US 8,269,666 B2

HIGH FREQUENCY MODULE FOR FILLING LEVEL MEASUREMENTS IN THE W-BAND

REFERENCE TO RELATED APPLICATIONS

This application claims the benefit of the filing date of EP Application Serial No. 08 167 856.7 filed on Oct. 29, 2008 and U.S. Provisional Patent Application Ser. No. 61/109,319 filed on Oct. 29, 2008, the disclosure of which applications is hereby incorporated herein by reference.

FIELD OF THE INVENTION

The present invention relates to fill level measuring. In particular, the invention relates to a high-frequency module for fill level measuring at frequencies of more than 75 GHz, to a fill level radar with a high-frequency module, and to a method for operating a fill level sensor with a high-frequency module.

TECHNOLOGICAL BACKGROUND

The use of high frequencies in fill level measuring provides many advantages. For example, in this way the components of sensors may be kept smaller.

In fill level measuring in the high-frequency range there are three different frequency bands. Firstly the so-called C-band, which ranges from 4 to 8 GHz; the K-band, which ranges from 18 to 27 GHz; and the so-called W-band, which approximately ranges from 75 to 110 GHz.

When compared to other frequency bands, the high frequencies of the W-band may require particular design techniques in the construction of the HF module, which design techniques may not be necessary at frequencies in the C-band and K-band.

While in the electronics modules of fill-level radar devices (so-called radar front-ends), which operate in the C-band or in the K-band, exclusively housed high-frequency components (HF components) may be used, in the W-band so far, generally speaking, only non-housed components may have been used. The reason for this is that in the case of the high frequencies in the W-band the parasitic effects of a component housing may very considerably impede the function of the high-frequency components and also the functions of the monolithic microwave integrated circuits (MMICs).

SUMMARY OF THE INVENTION

The present invention relates to a high-frequency module for fill level measuring, a fill level radar and a method for operating a fill level sensor. The exemplary embodiments described relate equally to the high-frequency module, to the fill level radar and to the method. In other words, the characteristics which hereinafter have been mentioned in relation to the high-frequency module can also be implemented in the method or in the fill level radar and vice versa.

According to an exemplary embodiment of the invention, a high-frequency module for fill level measuring and for the use at frequencies of more than 75 GHz, in particular for use at frequencies in the W-band, is stated. The high-frequency module comprises a chip in the form of a microwave semiconductor (also referred to as a microwave switching circuit, microwave IC, MMIC or high-frequency component) and a printed circuit board as well as a housing for the high-frequency module and in particular for the microwave semiconductor, which housing is conductively bonded, for example glued, onto the printed circuit board, so that the housing is conductively attached to the printed circuit board. The housing is not only used for the microwave semiconductor but for the entire HF circuit.

As a result of bonding and/or clamping the high-frequency housing or HF cover directly onto or to the printed circuit board, a more expensive installation of the microwave semiconductor in a milled housing may be avoided. Instead of using individual circuit components on ceramics, an overall printed circuit board can be used as a composite printed circuit board (e.g. FR4/Teflon) or a multilayer printed circuit board.

In this arrangement a composite printed circuit board is to be regarded as a special case of a multilayer printed circuit board. Generally speaking, the multilayer printed circuit board comprises several layers of an identical material (usually FR4). In a composite printed circuit board at least one layer comprises some other material, e.g. Teflon or a Teflon/ceramics mixture.

In order to bond the housing onto the printed circuit board, for example conductive silicon is used. There is no need to carry out roll seam welding or laser welding in order to seal the housing, because it is not mandatory for the housing to be airtight. There is no need to fill the housing with inert gas. Consequently the high-frequency module can be made economically, simply and at reduced effort.

According to a further exemplary embodiment of the invention, the housing is manufactured with the use of a zinc die-casting method or a metallised plastic. As a result of this, manufacturing costs can be reduced.

Since it is not mandatory for the housing to be airtight, contacting the microwave semiconductor or the lines for controlling or supplying the HF module from the interior of the housing towards the outside by way of customary SMD connectors becomes possible, instead of the use of hermetically sealed glass leadthroughs.

The signal lines (microwave signals) are fed to the outside by means of a waveguide coupling in the printed circuit board. All the other lines for controlling or supplying the HF module are transmitted by way of a connector (in this case as an SMD version). Said connector is, for example, arranged on the back of the printed circuit board, in other words not under the HF housing. The HF housing itself is bonded onto the printed circuit board so as to be airtight. Accordingly, glass windows or glass leadthroughs as are necessary in the state of the art for waveguide decoupling or for control lines and supply lines are thus not required.

Nor may be there any need for encapsulating the microwave semiconductor.

According to a further exemplary embodiment of the invention, the housing comprises one or several integrated separators to shield against electromagnetic radiation, which separator/s (also denoted as separator elements) is/are also made from metal.

For example, the separator and the housing are designed in a single piece. It is also possible for the separator to be bonded to the housing or to be attached thereto in some other manner.

According to a further exemplary embodiment of the invention, the housing (if applicable in addition to the integrated metal separator) comprises one or several separators for shielding electromagnetic radiation, which separator is made from attenuation material or comprises attenuation material.

According to a further exemplary embodiment of the invention, the high-frequency module is designed for supplying voltage to the microwave semiconductor in pulsed operation.

In this way the energy consumption of the microwave semiconductor and thus the heat transfer of the microwave semiconductor to the environment may be reduced.

It should be noted that for this exemplary embodiment and for the exemplary embodiments stated below the described housing may not be necessary. The microwave semiconductor can also be used without the housing if protection provided by the housing is not required.

According to a further exemplary embodiment of the invention, the high-frequency module is designed in such a way that in pulsed operation in a switch-on process of the microwave semiconductor first a negative supply voltage and then a positive supply voltage is applied to the microwave semiconductor. In a switch-off process of the microwave semiconductor first the positive supply voltage and then the negative supply voltage is switched off.

According to a further exemplary embodiment of the invention, the microwave semiconductor is placed on the printed circuit board.

For example, the microwave semiconductor is bonded directly to the printed circuit board.

According to a further exemplary embodiment of the invention, the high-frequency module comprises metallisation that is arranged between the microwave semiconductor and the printed circuit board. In this case the microwave semiconductor is thus not placed directly onto the printed circuit board, but instead onto the metallisation that is present on the printed circuit board.

According to a further exemplary embodiment of the invention, a signal line is provided on the printed circuit board, which signal line is connected to the microwave semiconductor. By way of this signal line the microwave semiconductor is connected to the exterior of the housing, in other words to the environment of the housing.

According to a further exemplary embodiment of the invention, the printed circuit board is designed as a composite printed circuit board with several layers.

According to a further exemplary embodiment of the invention, the high-frequency module is designed for use by a radar sensor for fill level measuring. In particular, the high-frequency module is designed for pulse radar operation.

According to a further exemplary embodiment of the invention, a fill level radar with a high-frequency module as described above is stated.

According to a further exemplary embodiment of the invention, a method for operating a fill level sensor with a high-frequency module as described above is stated, in which the microwave semiconductor of the high-frequency module is supplied with voltage in pulsed operation.

According to a further exemplary embodiment of the invention, the method for carrying out pulsed operation in each cycle of pulsed operation comprises a process for applying a supply voltage, and a process for switching off the supply voltage. When applying the voltage, first a negative supply voltage is applied, and then a positive supply voltage is applied to the microwave semiconductor for switching on the microwave semiconductor in a cycle of pulsed operation. During switching off, first the positive supply voltage is switched off, and then the negative supply voltage is switched off for switching off the microwave semiconductor in the cycle of pulsed operation.

Below, exemplary embodiments of the invention are described with reference to the figures.

DETAILED DESCRIPTION OF EXEMPLARY EMBODIMENTS

Figure 1:
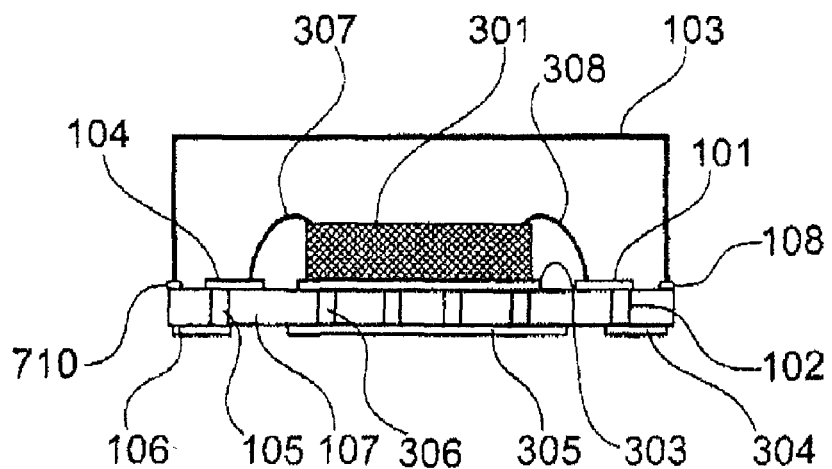
FIG. 1 shows a diagrammatic cross-sectional view of a high-frequency module.

The illustrations in the figures are diagrammatic and not to scale.

DETAILED DESCRIPTION

In the following description of the figures the same reference characters are used for identical or similar elements.

FIG. 1 shows a cross-sectional view of a high-frequency module that comprises a microwave semiconductor (chip) 301 which has been placed on a base board 107 (for example made of ceramic material). Between the base board 107 and the chip 301 there is a metal layer 303.

The chip 301 is connected to the ongoing signal lines 104 or 101 by way of the bond wires 307, 308. By way of corresponding through-hole platings 102, 105 the signal lines 101, 104 are led through the base board 107 and then continue on the underside of the base board (see reference characters 304, 106).

Furthermore, through-hole platings 306 are provided underneath the chip 301, which through-hole platings 306 are connected to the metallic mass connection 305 on the underside of the base board. These through-hole platings are used to lead away heat.

A purpose of the metal contacts 304, 106 is to be soldered onto a printed circuit board (not shown).

Furthermore, a housing 103 is provided, which is bonded to the base board 107 so as to be hermetically sealed. The bonded connection 710, 108 is used for bonding.

The mass connection from the printed circuit board to the chip is ensured with several through-hole platings through the base board. Likewise, the signal line is led to the outside by means of through-hole platings. Installation of the component finally takes place by soldering it onto the printed circuit board.

However, it may not be possible to apply this housing technique and connection technique at frequencies of the W-band. The component housing itself, as well as leading the signal line through the base board, may otherwise result in very strong parasitic effects, e.g. attenuation and mismatching. Therefore, in the W-band the non-housed chip is connected by means of short bond wires directly to the signal line on the printed circuit board (see FIG. 2).

Figure 2:
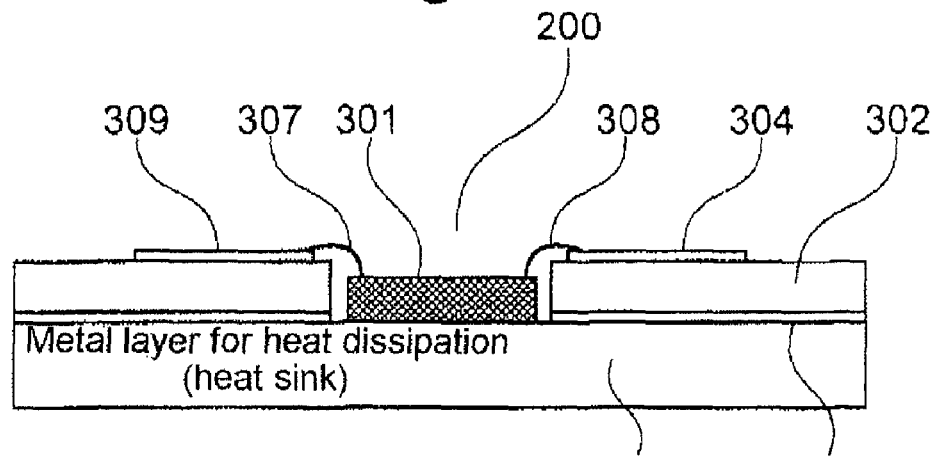
FIG. 2 shows a diagrammatic cross-sectional view of a further high-frequency module.

FIG. 2 shows a section view of a high-frequency module, for example for use in the W-band. The microwave semiconductor or chip 301 has been placed in a recess 200 in the printed circuit board 302. The chip 301 is connected to the corresponding signal lines 309, 304 by way of the bond wires 307, 308. The printed circuit board 302 is an HF printed circuit board.

Furthermore, metallisation 201 is provided on the underside of the printed circuit board, e.g. made of copper (mass layer).

The metallised underside of the HF printed circuit board is placed onto a metal layer for the purpose of heat dissipation 202, which metal layer thus acts as a heat sink.

In other words, the chip 301 has thus been placed in a cavity that has, for example, been milled out of the printed circuit board.

The microwave semiconductors for the W-band are, for example, made from the semiconductor material gallium arsenide (GaAs), because as a result of its high achievable limit frequency GaAs is eminently suitable for application in the millimetre wave range. However, high-frequency components comprising GaAs are associated with the disadvantage of increased power consumption and power dissipation when compared to other semiconductor materials such as, for example, silicon. Even when no input signal is present, the chips consume power and produce dissipation power in the form of heat that has to be dissipated. For this reason the chips are usually bonded directly to a metal layer as a heat sink, which metal layer on the one hand ensures good electrical mass connection to the underside of the chip, and on the other hand is used for heat dissipation. However, this design technique is very expensive when compared to conventional SMD mounting techniques as used, for example, in the K-band module of fill-level radar sensors.

It may thus be necessary, either to elaborately mill cavities into the printed circuit board, or to compose the circuit from several smaller printed circuit boards that are bonded into a metal housing between which housing the chips are placed.

Figure 3:
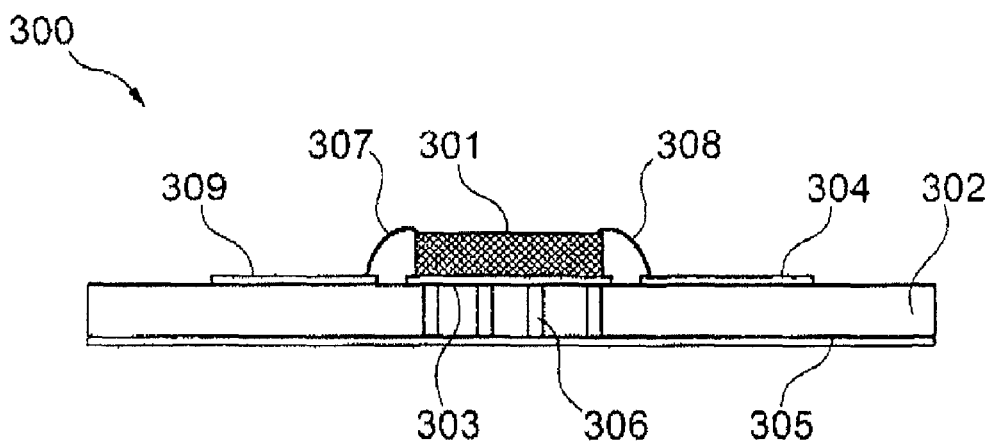
FIG. 3 shows a cross-sectional view of a high-frequency module according to an exemplary embodiment of the invention.

FIG. 3 shows a high-frequency module 300 without a heat sink for use in the W-band. In this arrangement the chip 301 has been placed onto metallisation 303 on the printed circuit board 302. By way of the bond wires 307, 308 the chip is connected to the signal lines 309, 304. The signal lines 309, 304 are located on the same side of the printed circuit board 302 as is the chip 301. No through-hole platings for the signal lines are required.

The printed circuit board 302 is, for example, a multilayer printed circuit board.

On the back of the printed circuit board 302 there is metallisation, for example in the form of a copper layer as a mass layer 305. For mass connection of the chip, through-hole platings 306 are provided underneath the chip.

The pulse radar method, which may be used in fill level sensors, provides an advantage in that the semiconductor components that process the transmit- or receive pulse only need to be switched on at those points in time at which a radar pulse is present. At all other times the supply voltage of the microwave semiconductor can be switched off.

As a result of this measure the average power consumption and consequently also the average dissipation power of the chips can be significantly reduced. A reduction in the average power consumption of the radar module is desirable with a view to the two-conductor capability, in other words the supply of the sensor with 4 . . . 20 mA current.

The produced quantity of heat, which needs to be dissipated by way of the heat sink, may also reduce in the case of pulsed operation. From a particular ratio of switch-on duration to period duration (pulse-pause ratio or duty cycle) of the pulse radar, in pulsed operation it is possible to do entirely without a heat sink for the HF semiconductor. The ratio depends, for example, on the thermal conductivity of the printed circuit board and of the bonding agent used, on the electrical power picked up, on the efficiency of the semiconductor, and on the chip area itself.

By being able to do without a heat sink the design of the printed circuit board may be considerably simplified and may be achieved more economically. The microwave semiconductor is directly bonded onto the HF printed circuit board (so-called chip-on-board mounting). Through-hole platings underneath the chip ensure good electrical mass connection from the mass layer of the HF printed circuit board to the metal area underneath the chip. In particular, this also does not require any recesses or cavities in the HF printed circuit board.

In the chip-on-board technique the connections from the signal line on the printed circuit board to the chip are also implemented with the use of short bond wires 307, 308. This design technique does not have a significantly disadvantageous effect on the HF characteristics of the microwave semiconductor.

Below, the pulsed voltage supply of the microwave semiconductor is described in detail using the example of the W-band multiplier chip CHU3377 of United Monolithic Semiconductors (UMS). This is a gallium arsenide chip that multiplies an input signal in the frequency range of 12.67 GHz to 12.83 GHz to an output frequency of 76 GHz to 77 GHz. At the same time the output signal in the W-band is further amplified with this component.

It should be noted that the high-frequency module according to the invention may be designed for frequencies above 75 GHz, for example for frequencies in the W-band, and in particular for frequencies of 79 GHz. Likewise, the high-frequency module may also be designed for lower frequencies, for example for frequencies of approximately 26 GHz.

Figure 4:
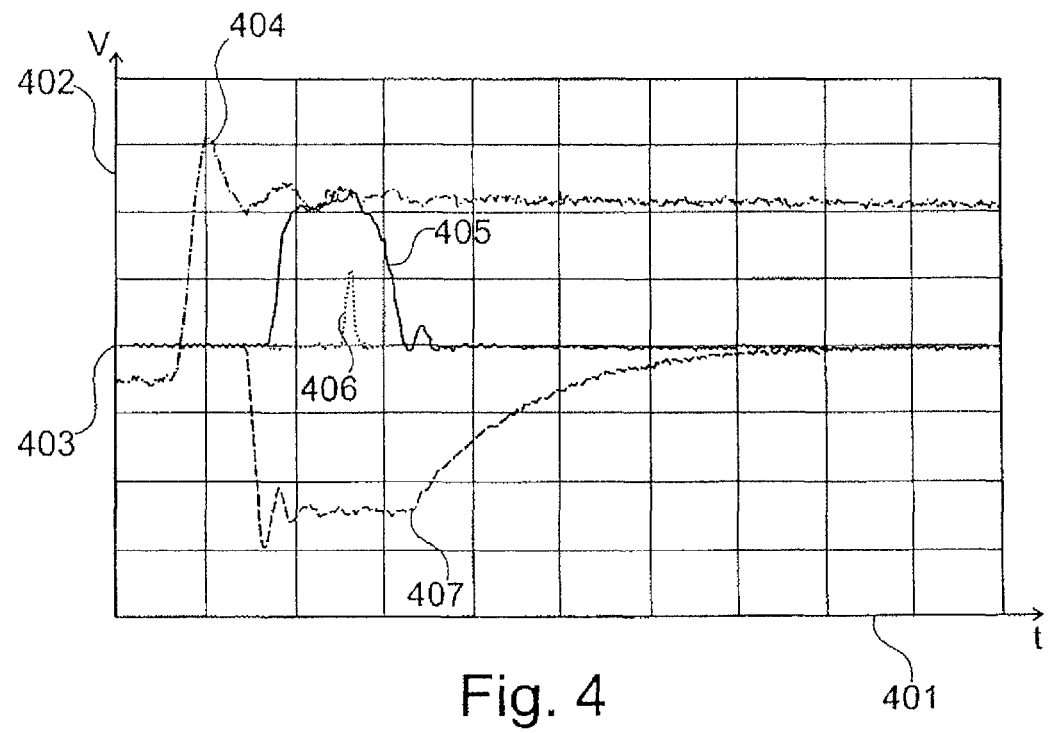
FIG. 4 shows a diagram of time-related switching of the supply voltages according to an exemplary embodiment of the invention.

FIG. 4 shows the time course of the supply voltages with the use of the W-band multiplier MMIC CHU3377 in pulsed operation according to an exemplary embodiment of the invention. The horizontal axis 401 shows the time course with the unit 10 ns/div, thus ranging from 0 nanoseconds to 100 nanoseconds.

The vertical axis 402 shows the voltage in units of 2 V/div, thus ranging from −8V to +8V.

Reference character 403 shows the zero point of voltage. Curve 404 shows the pulse signal (PRF), curve 405 the positive voltage supply, curve 407 the negative voltage supply, and curve 406 the control signal for the pulse generator.

The diagram shows that the positive voltage supply is switched on before the negative voltage supply, and is switched off before the negative voltage supply.

The multiplier needs two direct currents for supply. One voltage is in the region of +4.5 V, while the other voltage is in the region of −4.5 V. By applying the two supply voltages, all the transistors on the chip are brought to their working point (so-called on-chip self-biasing). It should be noted that it is imperative that the negative supply voltage is always applied before the positive supply voltage. Otherwise the chip may be destroyed as a result of excessive current uptake. Correspondingly, during switch-off it is imperative that first the positive voltage is cut off before the negative voltage is cut off. In the case of FIG. 4 the negative supply voltage is switched on for approximately 30 nanoseconds. The positive supply follows approximately 2 to 3 nanoseconds later and is applied for a total of 10 nanoseconds.

In continuous-wave (CW) signal operation the power consumption of the chip is approximately 900 mW on the positive supply voltage, and approximately 45 mW on the negative supply voltage. As a result of pulsed operation the average power consumption on the positive supply can be reduced to approximately 50 mW and on the negative supply to approximately 6 mW.

Figure 5:
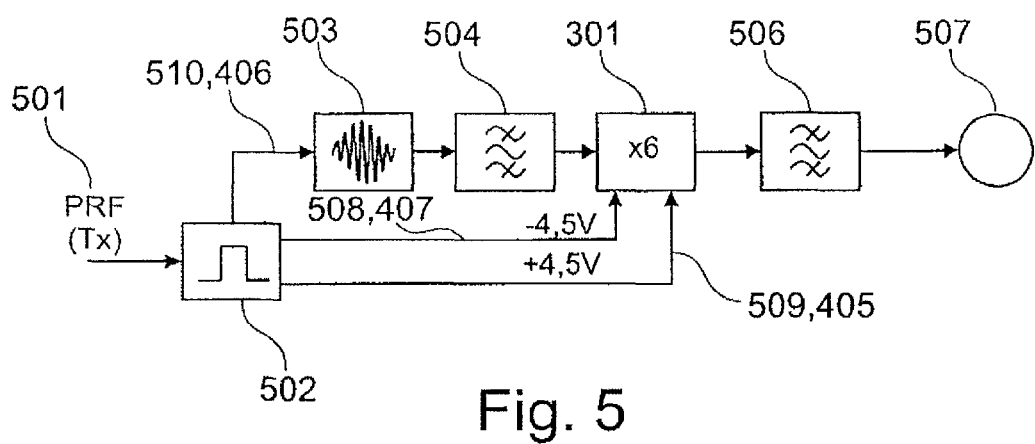
FIG. 5 shows a block diagram of a high-frequency module according to an exemplary embodiment of the invention.

FIG. 5 shows a block diagram of a W-band transmission branch with a pulse generator 503 and a multiplier 301 with pulsed voltage supply according to an exemplary embodiment of the invention. The PRF (Tx) signal 501 is pulsed and time-controlled by way of the control unit 502. In particular, by way of the line 510 a control signal 406 (see FIG. 4) is emitted to the pulse generator 503. The signal generated by the pulse generator 503 then passes through a band-pass filter 504 and subsequently is forwarded to the multiplier 301. Likewise, the control unit 502 generates the negative supply voltage and the positive supply voltage that are transmitted by way of the lines 508 or 509 to the multiplier 301. The signal generated in the multiplier 301 is then passed to a band-pass filter 506, after which it is, for example, coupled into a round waveguide 507.

Figure 6:
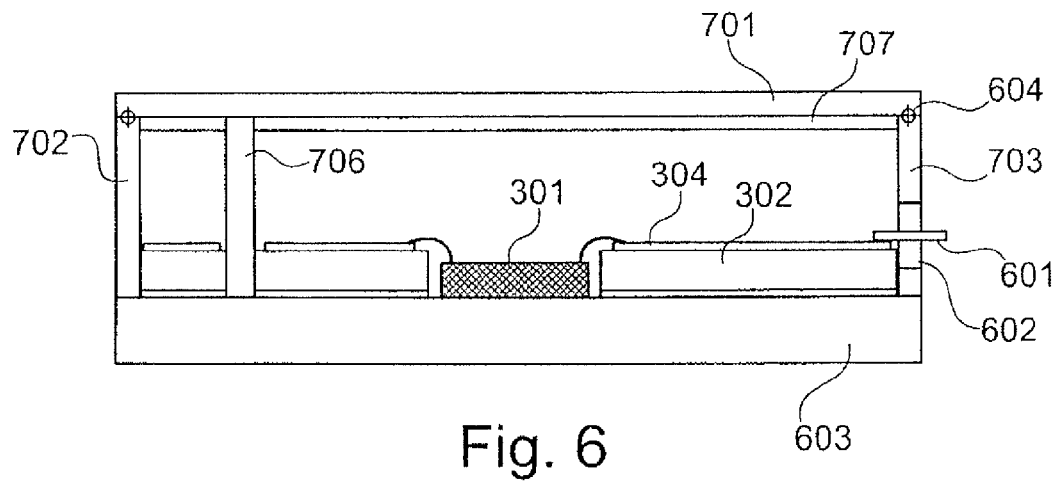
FIG. 6 shows a cross-sectional view of a further high-frequency module.

FIG. 6 shows a high-frequency module with a housing. The housing comprises a top 701 as well as right-hand and left-hand lateral parts 703, 702 that are welded to the top 701 by way of the weld connections 604. The space within the housing is filled with inert gas. The housing is airtight. The signal line 304 is led from the housing by way of a soldered-in glass leadthrough 601, 602.

The underside 603 also forms part of the metal housing. Thus the entire printed circuit board with the chip 301 embedded in the recess is arranged in the airtight housing. Furthermore, separators 706 for internal shielding can be provided, as can an attenuation material 707 at the top interior of the housing.

For shielding and for protection against external influences, the printed circuit board of the HF module is installed in the housing. The chip 301, which is, for example, located in a cavity of the printed circuit board, is bonded in the printed circuit board directly onto the metallic housing bottom 603. The metallic housing bottom is at the same time used as a heat sink. The housing cover 701 is hermetically sealed by means of roll seam welding or laser welding. For protection against corrosion, the interior of the housing is filled with inert gas. Electrical connections to the outside are possible only by way of soldered-in glass leadthroughs, which are elaborate and thus comparatively expensive to produce. Alloys that have the same thermal expansion characteristics as the soldered-in glass leadthroughs can be used as housing materials. Thus, most of the time Kovar or Invar alloys are used as housing materials.

The separators 706 in the interior of the housing are used to shield various switching components from each other. The bonded-in attenuation material 707 on the housing lid is used to suppress housing resonance. Such a housing is relatively complex, requires the use of special materials, components and technologies, and can therefore not be produced economically.

Figure 7:
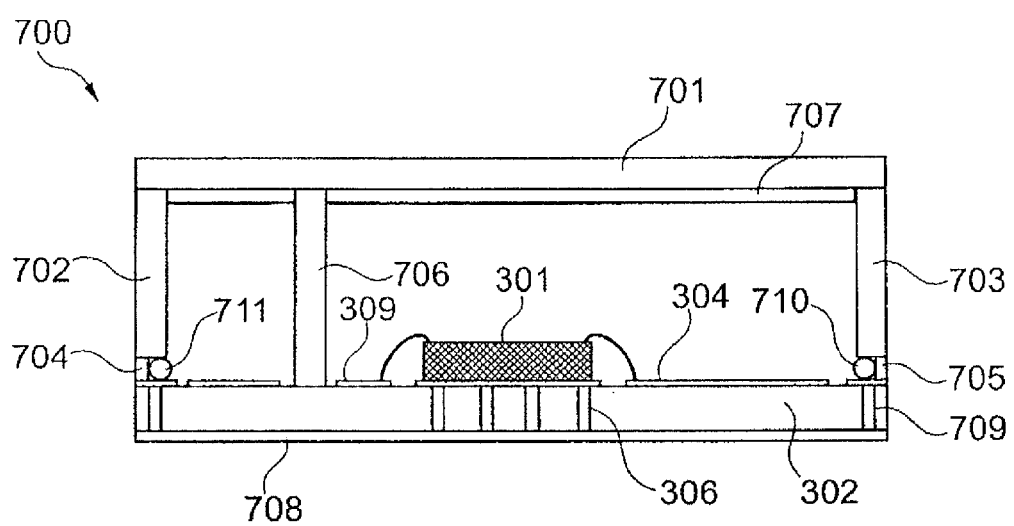
FIG. 7 shows a cross-sectional view of a high-frequency module according to a further exemplary embodiment of the invention.

FIG. 7 shows a high-frequency module with a housing according to an exemplary embodiment of the invention.

The microwave semiconductor 301 comprises passivation that protects it against environmental influences. In many application cases this passivation provides adequate protection. There is no need to provide hermetic sealing of the housing, nor is there a need to provide an inert gas atmosphere. Moreover, there is no need to provide a heat sink, so that the housing design can be implemented significantly more simply and thus also more economically.

In particular, the metal cover 701 with the sidewalls 702, 703, 704, 705 is directly bonded onto the printed circuit board 302 by means of a conductive adhesive material 710, 711. In this arrangement the printed circuit board may well be designed as a compound printed circuit board comprising several different layers, a so-called multilayer printed circuit board. In this design there is no need to provide roll seam welding or laser welding to close the housing.

The housing cover may be made in a single piece or it may be made from several individual pieces (top 701 and lateral parts 702, 704, 703, 705). For reasons associated with costs the cover, instead of being a milled part, may be made of zinc die-cast or of a metallised plastic material.

Furthermore, internal separators 706 are provided, which are used to provide shielding within the housing. These separators can already be integrated in the cover and can thus also be designed so as to be metallic. Another option involves designing the internal separators 706 of an attenuation material in the same way as the attenuation material in the ceiling region 707. Furthermore, it is possible to provide either metallic separators or separators comprising attenuation material.

It is thus now only necessary to keep one housing blank in stock for various printed circuit boards. The various versions of the housing for the different printed circuit boards are implemented by different insertion components (separators) or different injection of attenuation material with subsequent hardening. The electrical connections to the outside, instead of being implemented by means of glass leadthroughs, are made my means of through-hole platings in the printed circuit board, which through-hole platings in turn are connected to SMD connectors.

In the exemplary embodiment of FIG. 7, too, the underside of the printed circuit board 302 comprises a metallic layer 708.

The (flexible) separators 706 can be pressed onto the printed circuit board; they are not led through the printed circuit board (as is the case in the exemplary embodiment of FIG. 6).

Figure 8:
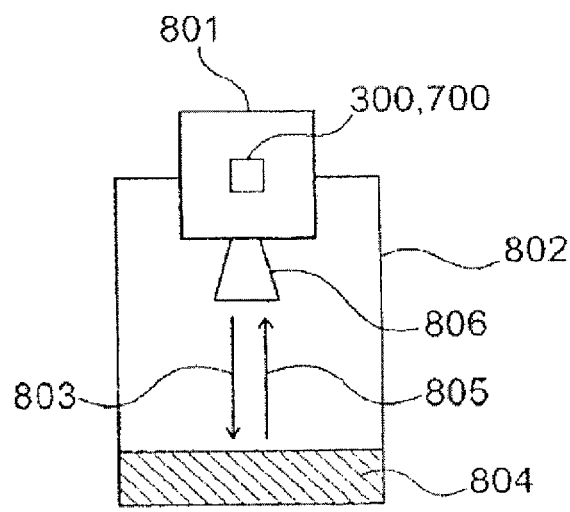
FIG. 8 shows a fill level radar according to an exemplary embodiment of the invention.

FIG. 8 shows a fill level radar according to an exemplary embodiment of the invention. The fill level radar 801 comprises a high-frequency module 300, 700. The radar signal 803 generated by the high-frequency module is emitted in the direction of the product surface 804 and is reflected by the product surface. The resulting reflection signal 805 is received by the antenna 806 of the fill level radar and is subsequently evaluated. The fill level radar is, for example, installed in a container 802.

Figure 9:
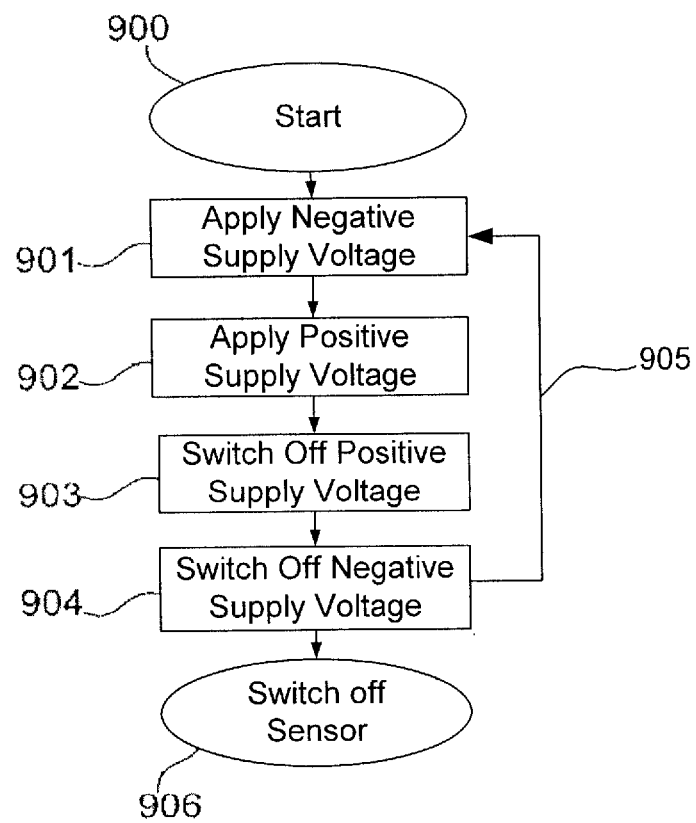
FIG. 9 shows a flow chart of a method according to an exemplary embodiment of the invention.

FIG. 9 shows a flow chart of a method in which in step 900 fill level measuring is started. In step 901 a negative supply voltage is applied to the microwave semiconductor, and in step 902 a positive supply voltage is then applied to the microwave semiconductor. In step 903 the positive supply voltage is switched off, and in step 904 the negative supply voltage is switched off. After this, step 901 starts anew (see step 905). In this way, pulsed operation of the voltage supply of the microwave semiconductor is implemented. After the various readings have been obtained the sensor can be switched off (see step 906).

In addition, it should be pointed out that "comprising" does not exclude other elements or steps, and "a" or "one" does not exclude a plural number. Furthermore, it should be pointed out that characteristics or steps which have been described with reference to one of the above exemplary embodiments can also be used in combination with other characteristics or steps of other exemplary embodiments described above. Reference characters in the claims are not to be interpreted as limitations.

The invention claimed is:

1. A high-frequency module for fill level measuring at frequencies of more than 75 gigahertz, comprising:
   an electrically conductive housing;
   at least one microwave semiconductor; and
   a printed circuit board;
   wherein the housing of the high-frequency module is electrically conductively bonded to the printed circuit board by means of a conductive adhesive material.

2. The high-frequency module according to claim 1, wherein the housing is made of a zinc die-casted material.

3. The high-frequency module according to claim 1, wherein the housing is made of a plastic injection-molded material which is metalized.

4. The high-frequency module according to claim 1, wherein the housing includes an integrated separator element to shield against electromagnetic radiation, the separator element being made from metal.

5. The high-frequency module according to claim 1, wherein the housing includes a separator element to shield against electromagnetic radiation, the separator element includes attenuation material.

6. The high-frequency module according to claim 1, wherein the high-frequency module supplies voltage to the microwave semiconductor in pulsed operation.

7. The high-frequency module according to claim 6, wherein in pulsed operation, in a switch-on process first a negative supply voltage and then a positive supply voltage is applied to the microwave semiconductor; and wherein in a switch-off process, first the positive supply voltage and then the negative supply voltage is switched off.

8. The high-frequency module according to claim 6, wherein the microwave semiconductor is disposed on the printed circuit board.

9. The high-frequency module according to claim 8, further comprising:
   metallisation arranged between the microwave semiconductor and the printed circuit board.

10. The high-frequency module according to claim 6, wherein the microwave semiconductor is bonded directly to the printed circuit board.

11. The high-frequency module according to claim 1, further comprising:
    at least one signal line on the printed circuit board, the signal line being connected to the microwave semiconductor.

12. The high-frequency module according to claim 1, wherein the printed circuit board is a multilayer printed circuit board.

13. A fill level radar, comprising:
    a high-frequency module with an electrically conductive housing including at least one microwave semiconductor; and
    a printed circuit board;
    wherein the housing of the high-frequency module is electrically conductively bonded to the printed circuit board by means of a conductive adhesive material.

14. A method for operating a fill level sensor with a high-frequency module with an electrically conductive housing, comprising:
    supplying at least one microwave semiconductor of the high-frequency module with voltage in pulsed operation,
    wherein the high-frequency module further includes a printed circuit board, and
    wherein the housing of the high-frequency module is electrically conductively bonded to the printed circuit board by means of a conductive adhesive material.

15. The method according to claim 14, further comprising:
    applying a negative supply voltage and then applying a positive supply voltage to the microwave semiconductor for switching on the microwave semiconductor in a cycle of pulsed operation; and
    switching off the positive supply voltage and then switching off the negative supply voltage for switching off the microwave semiconductor in the cycle of pulsed operation.

* * * * *